United States Patent
Schier et al.

(10) Patent No.: US 6,611,569 B1
(45) Date of Patent: Aug. 26, 2003

(54) DOWN/UP-CONVERSION APPARATUS AND METHOD

(75) Inventors: Thorsten Schier, Sundbyberg (SE); Svante Signell, Vällingby (SE)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 0 days.

(21) Appl. No.: 09/165,644

(22) Filed: Oct. 2, 1998

(30) Foreign Application Priority Data

Oct. 3, 1997 (SE) .............................................. 9703617

(51) Int. Cl.[7] .................................................. H03D 3/00
(52) U.S. Cl. ........................................ 375/322; 455/339
(58) Field of Search ................................ 375/271, 275, 375/321, 322, 331, 302, 335, 350; 455/104, 109, 110, 112, 118, 131, 139, 147, 189.1, 190.1, 203, 204, 245.2, 324, 307, 335, 339

(56) References Cited

U.S. PATENT DOCUMENTS

| | | | |
|---|---|---|---|
| 3,949,309 A | * 4/1976 | Pecar ........................ | 342/17 |
| 4,458,216 A | * 7/1984 | Bingham ................... | 332/151 |
| 4,710,814 A | * 12/1987 | Gassmann et al. ........ | 329/306 |
| 4,736,390 A | * 4/1988 | Ward et al. ............... | 375/75 |
| 4,803,700 A | * 2/1989 | Dewey et al. ............. | 329/357 |
| 5,473,280 A | * 12/1995 | Ohnishi et al. ............ | 329/304 |
| 5,517,529 A | 5/1996 | Stehlik | |
| 5,749,051 A | * 5/1998 | Dent .......................... | 455/317 |
| 5,786,782 A | * 7/1998 | Ostman et al. ............ | 341/141 |
| 5,821,782 A | * 10/1998 | Carloni et al. ............ | 327/105 |
| 5,825,242 A | * 10/1998 | Prodan et al. ............. | 329/304 |
| 5,903,609 A | * 5/1999 | Kool et al. ................. | 375/261 |
| 5,956,620 A | * 9/1999 | Lazaris-Brunner et al. | 455/12.1 |
| 6,035,186 A | * 3/2000 | Moore et al. .............. | 455/313 |
| 6,215,828 B1 | * 4/2001 | Signell et al. ............. | 375/316 |
| 6,275,540 B1 | * 8/2001 | Barrett et al. ............. | 375/316 |

FOREIGN PATENT DOCUMENTS

| | | |
|---|---|---|
| EP | 0 502 449 | 9/1992 |
| GB | 2 176 356 | 12/1986 |
| WO | 98/11672 | 3/1998 |

OTHER PUBLICATIONS

Jantzi, S.; Martin, K.; Snelgrove, M.; Sedra, A.; "A Complex Bandpass Delta–Sigma Converter for Digital Radio", 1994 IEEE International Symposium, vol.: 5, May 30–Jun. 2, 1994; pp. 453–456 vol. 5.*

Hambley, Allan R., "An Introduction to Communication Systems", *Computer Science Press*, pp82&103.

Signell, Svante, et al., "Design and Analysis of Bilinear Digital Ladder Filters", *IEEE Transactions on Circuits and Systems*, pp1–13.

Bracewell, Ronald N., "The Fourier Transform and its Applications" *McGraw–Hill Book Company*, pp107&267.

\* cited by examiner

*Primary Examiner*—Chi Pham
*Assistant Examiner*—Khanh Cong Tran

(57) ABSTRACT

A down-converter converts an amplitude modulated high frequency signal into a low frequency or baseband signal. A first mixer (30, 32) mixes the high frequency signal into a composite signal having an in-phase component and a quadrature component. A complex bandpass filter (34) bandwidth limits the composite signal into a bandwidth limited signal with an in-phase component and a quadrature component. A second mixer (36, 38) mixes the bandwidth limited signal into an intermediate signal with an in-phase component and a quadrature component, and an adder (40) adds one component of the intermediate signal to the other. A similar up-converter performs the reverse process.

10 Claims, 15 Drawing Sheets

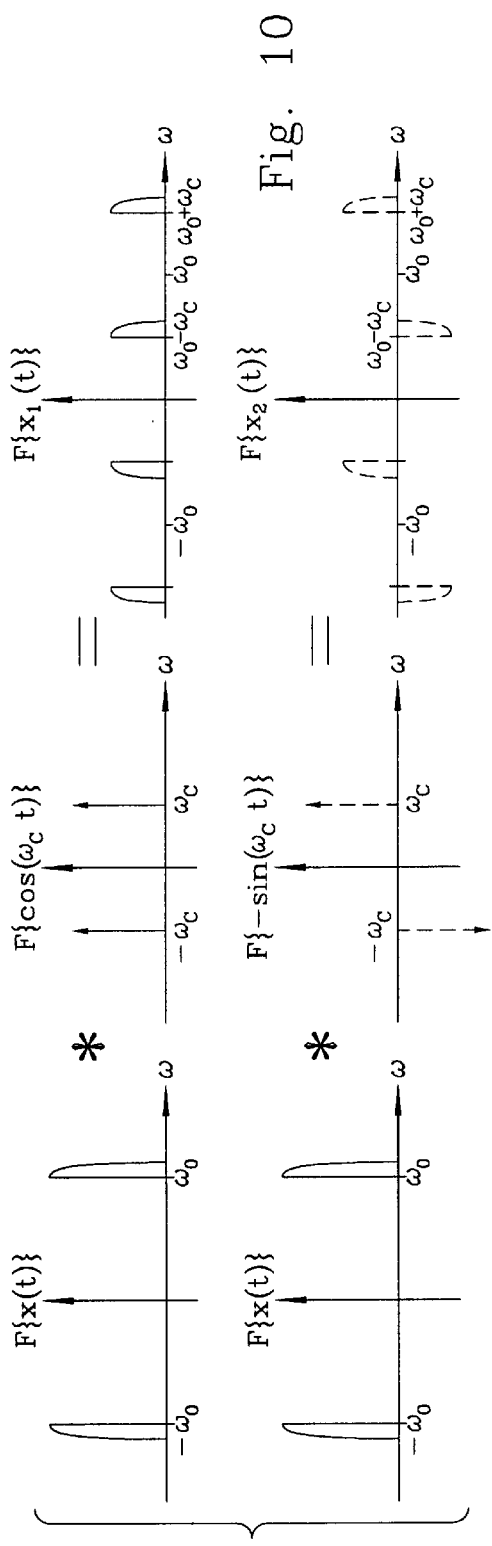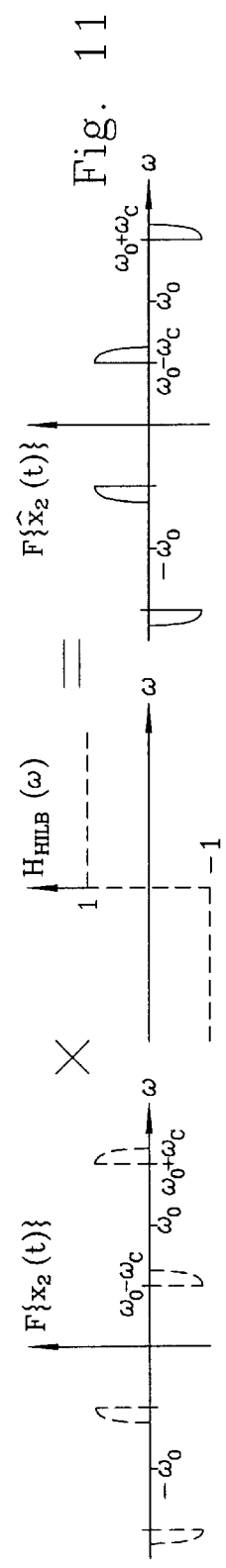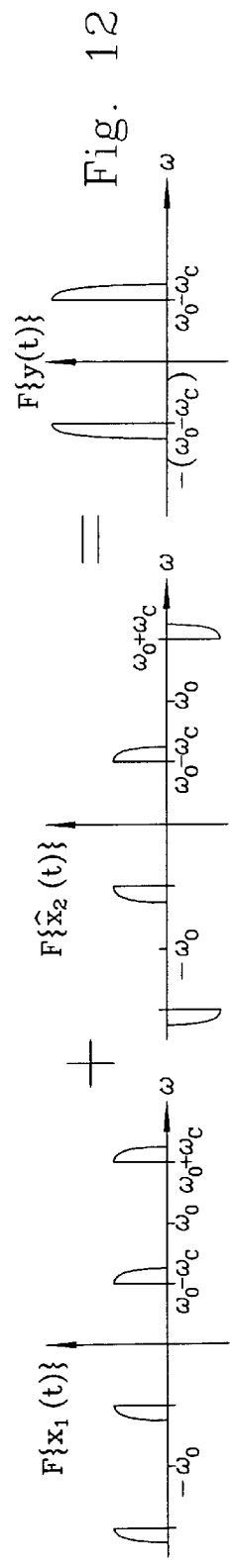
Fig. 10
Fig. 11
Fig. 12

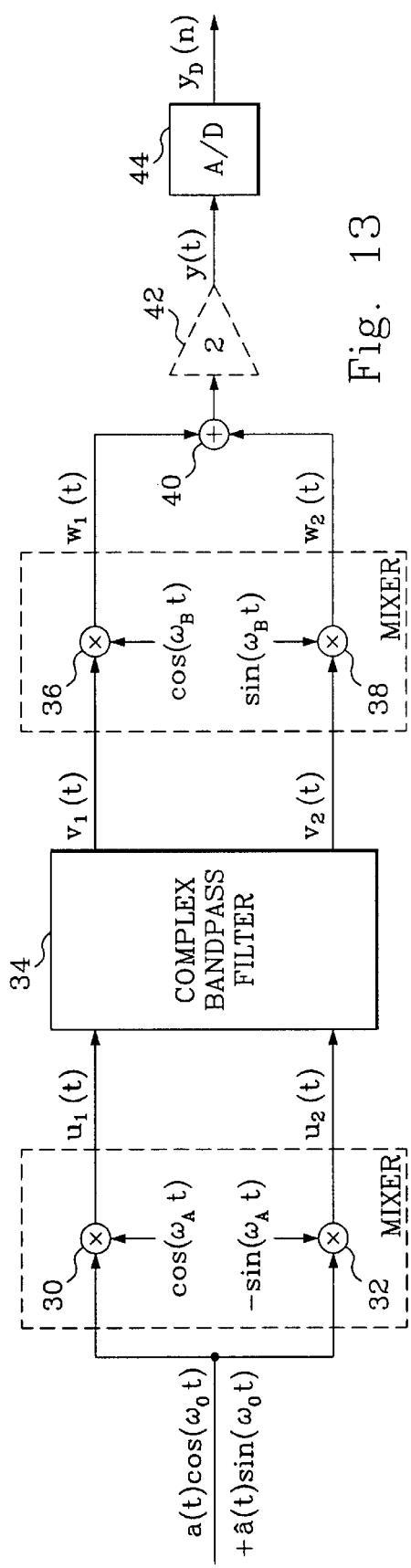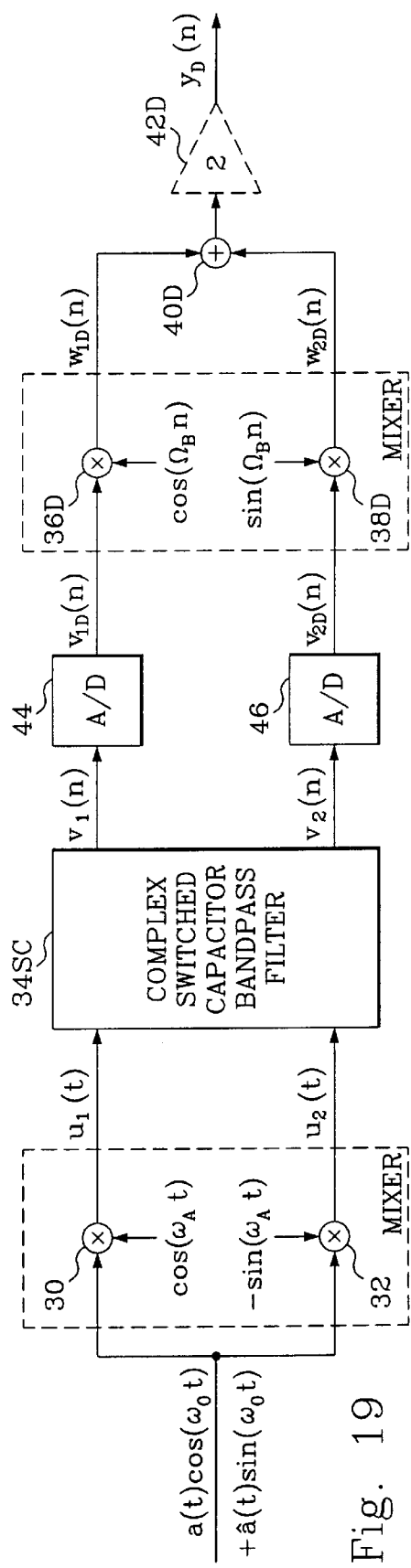

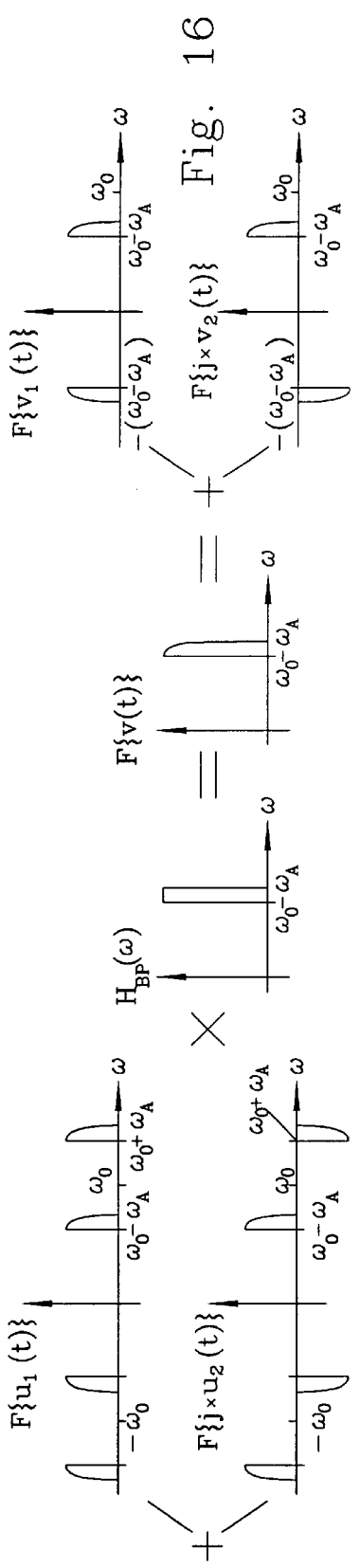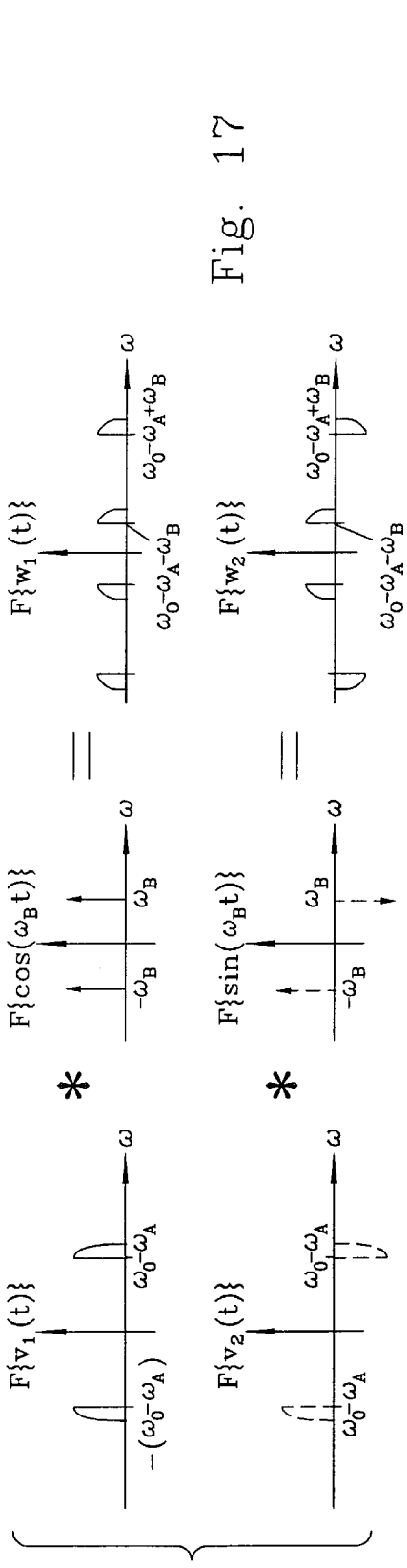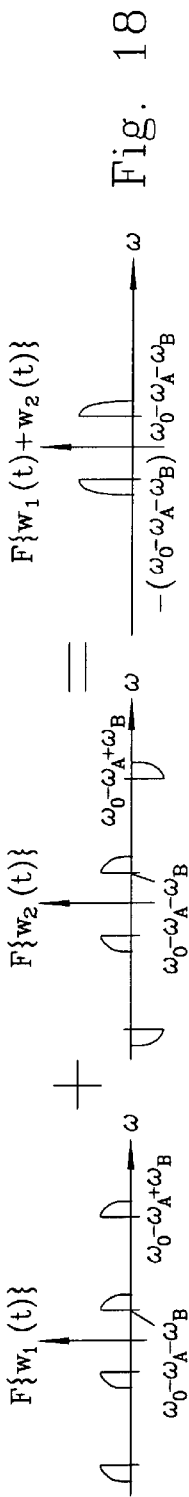

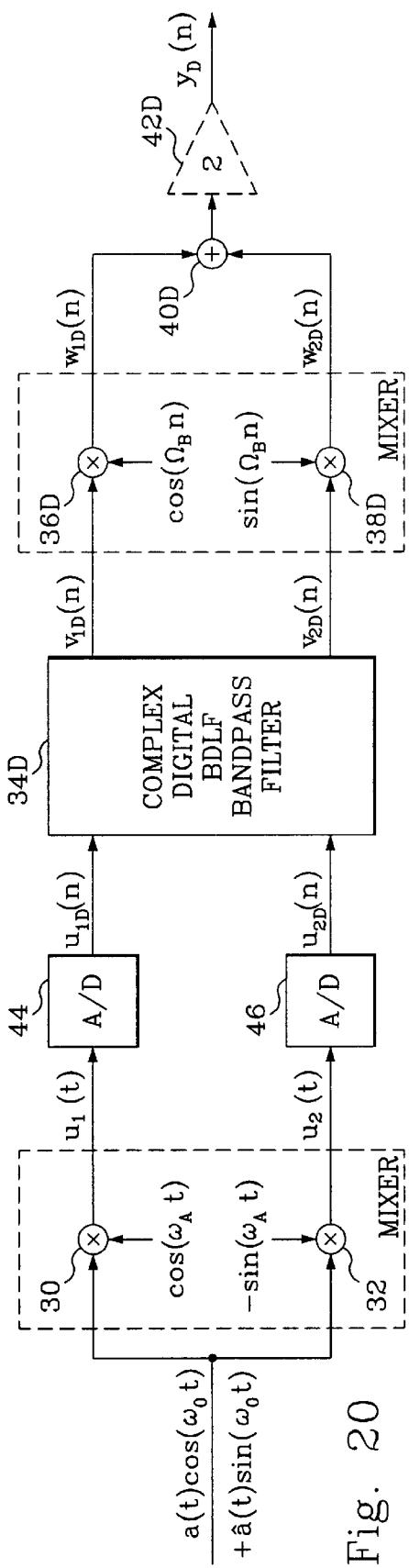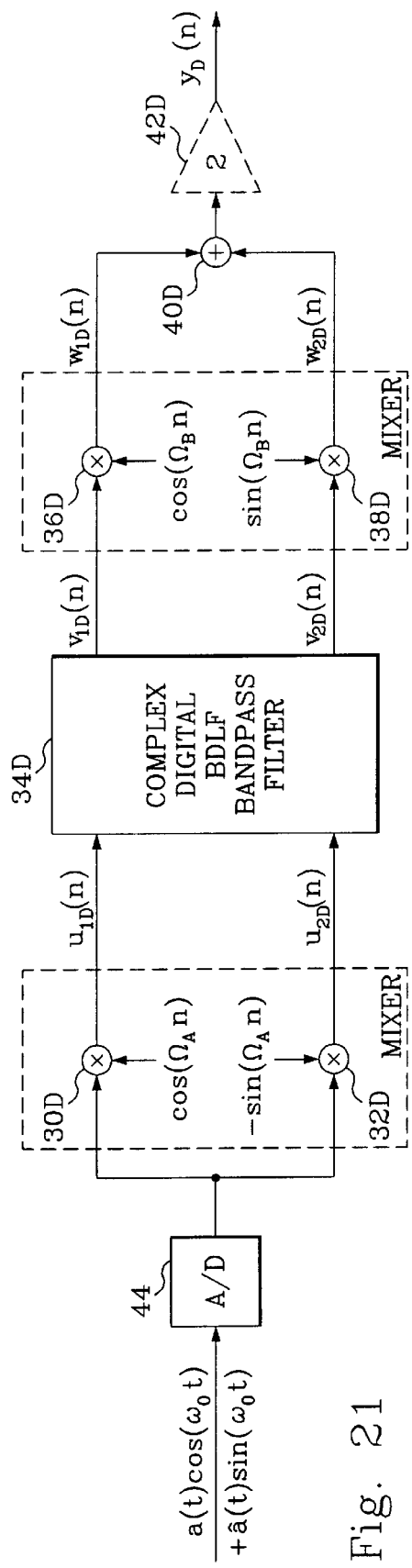
Fig. 20
Fig. 21

DOWN/UP-CONVERSION APPARATUS AND METHOD

This application claims priority under 35 U.S.C. §§119 and/or 365 to 9703617-2 filed in Sweden on Oct. 3, 1997; the entire content of which is hereby incorporated by reference.

TECHNICAL FIELD

The present invention relates to a down/up-converter and a down/up-conversion method for high/low frequency signals.

BACKGROUND OF THE INVENTION

Down- and up-conversion is used in, for example, single sideband demodulators and modulators. A common technique (see [1]) for demodulation involves a mixer, which multiplies the incoming signal with two 90° phase-shifted sinusoidal signals, and a Hilbert filter for one of the resulting components (in-phase or quadrature component). The output signal from the Hilbert filter is then added or subtracted to or from the other component, depending on whether the lower or upper sideband is desired. Modulation is performed by using the same elements in the reverse order.

A drawback of this technique is that it is very difficult to design a lowpass Hilbert filter both in analog and digital form. Furthermore, in practice it may be difficult to perform the down-conversion to or up-conversion from baseband in one step (for example, cellular telephony systems often operate with carrier frequencies of the order of 1 GHz).

SUMMARY OF THE INVENTION

An object of the present invention is to provide an apparatus and method that avoids Hilbert filters.

Another object is to perform the down- or up-conversion in several mixing steps.

These objects are achieved with an apparatus and method in accordance with the appended claims.

Briefly, the present invention is based on the insight that complex filters automatically provide a 90° phase-shift between real and imaginary components of a complex signal. This feature, when combined with a second mixer, may be used to eliminate the undesirable Hilbert filter of the prior art. At the same time a two step conversion involving two mixers is obtained.

BRIEF DESCRIPTION OF THE DRAWINGS

The invention, together with further objects and advantages thereof, may best be understood by making reference to the following description taken together with the accompanying drawings, in which:

FIGS. 10–12 illustrate the operation of the down-converter of FIG. 9 in the frequency domain;

FIG. 13 is an embodiment of a down-converter in accordance with the present invention;

FIGS. 14–18 illustrate the operation of the down-converter of FIG. 14 in the frequency domain;

FIGS. 19–21 are block diagrams of other embodiments of the down-converter in accordance with the present invention;

DETAILED DESCRIPTION OF THE PREFERRED EMBODIMENTS

Throughout the figures of the drawings the same reference designations will be used for the same or similar elements.

Since the concept of complex filters, especially complex bandpass filters, is essential for the present invention, this description will start by introducing complex filters with reference to FIGS. 1–7.

Figure 1:
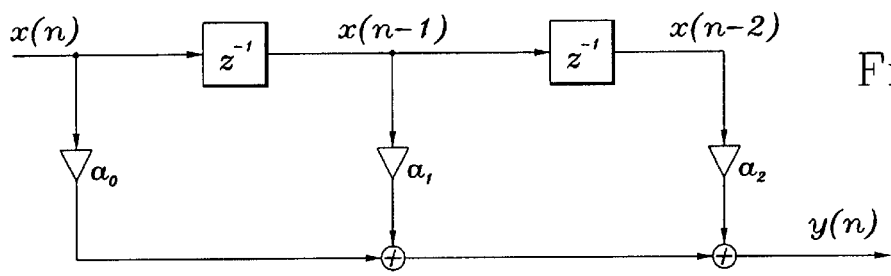
FIG. 1 is a block diagram of a simple FIR filter.

FIG. 1 illustrates a simple FIR filter having two delay elements denoted $z^{-1}$ and filter coefficients $a_0$, $a_1$, and $a_2$.

An essential component of the present invention is a complex bandpass filter. In accordance with a preferred embodiment such a complex bandpass filter is designed by designing a low-pass filter prototype having all the desired properties, i.e. passband ripple, transmission band and cut off frequency, and by frequency translating this low-pass filter into a complex bandpass filter. This frequency translation is done by substituting $z_0 \cdot z$ for z in the low-pass filter prototype transfer function. Here $z_0$ is a point on the unit circle defined by $$z_0 = e^{j\Omega_0 T} \tag{1}$$

where $\Omega_0$ is the center (angular) frequency of the passband of the translated complex filter and T is the sampling period.

Figure 2:
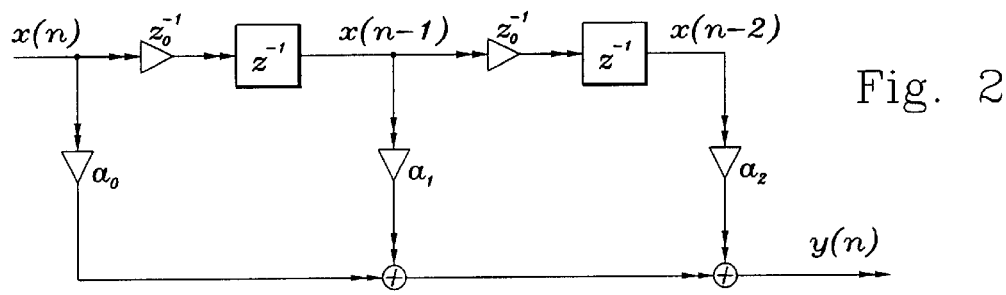
FIG. 2 is a block diagram of an embodiment of a corresponding complex FIR filter.

Assuming that FIG. 1 represents the low-pass filter prototype, the corresponding complex bandpass filter may be of the form shown in FIG. 2. In FIG. 2 a multiplication by a factor $z_0^{-1}$ is associated with each delay element $z^{-1}$. Furthermore, in FIG. 2 the signal paths have been provided with double arrow heads in order to emphasize that the signals may be complex valued.

Figure 3:
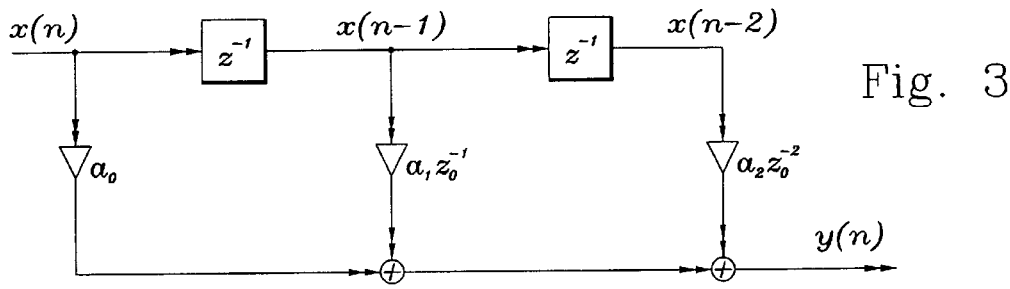
FIG. 3 is a block diagram of another embodiment of a complex FIR filter.

FIG. 3 shows an equivalent complex filter, in which the complex multiplication has been combined with the filter coefficients instead, thereby reducing the number of required multipliers. Thus, the transfer functions of the filters in FIGS. 2 and 3 are the same.

Figure 4:
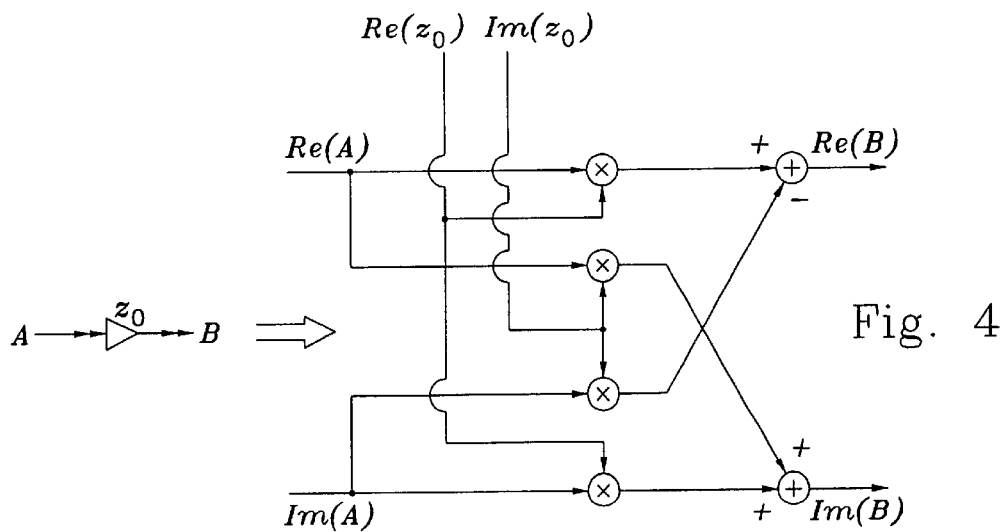
FIG. 4 is a block diagram illustrating complex multiplication performed by the filters in FIGS. 2 and 3.

FIG. 4 illustrates a possible implementation of a multiplication of a complex input signal a by a complex coefficient $z_0$ for obtaining a complex output signal B. As may be seen from FIG. 4 this is accomplished by splitting the signals A and B and the multiplication coefficient $z_0$ into their respective real and imaginary components and performing 4 real multiplications and 2 real additions.

An especially attractive form of digital filters are so called bilinear digital ladder filters (BDLF filters). The advantages of real BDLF filters are extensively discussed in [2]. This publication demonstrates that these filters outperform previously known real filter structures, such as wave digital filters (WDF filters) and cascade coupled biquads with respect to coefficient quantization and signal quantization noise levels. Furthermore, in comparison to WDF filters they turn out to have a less complicated structure in terms of the total number of required adders.

Figure 5:
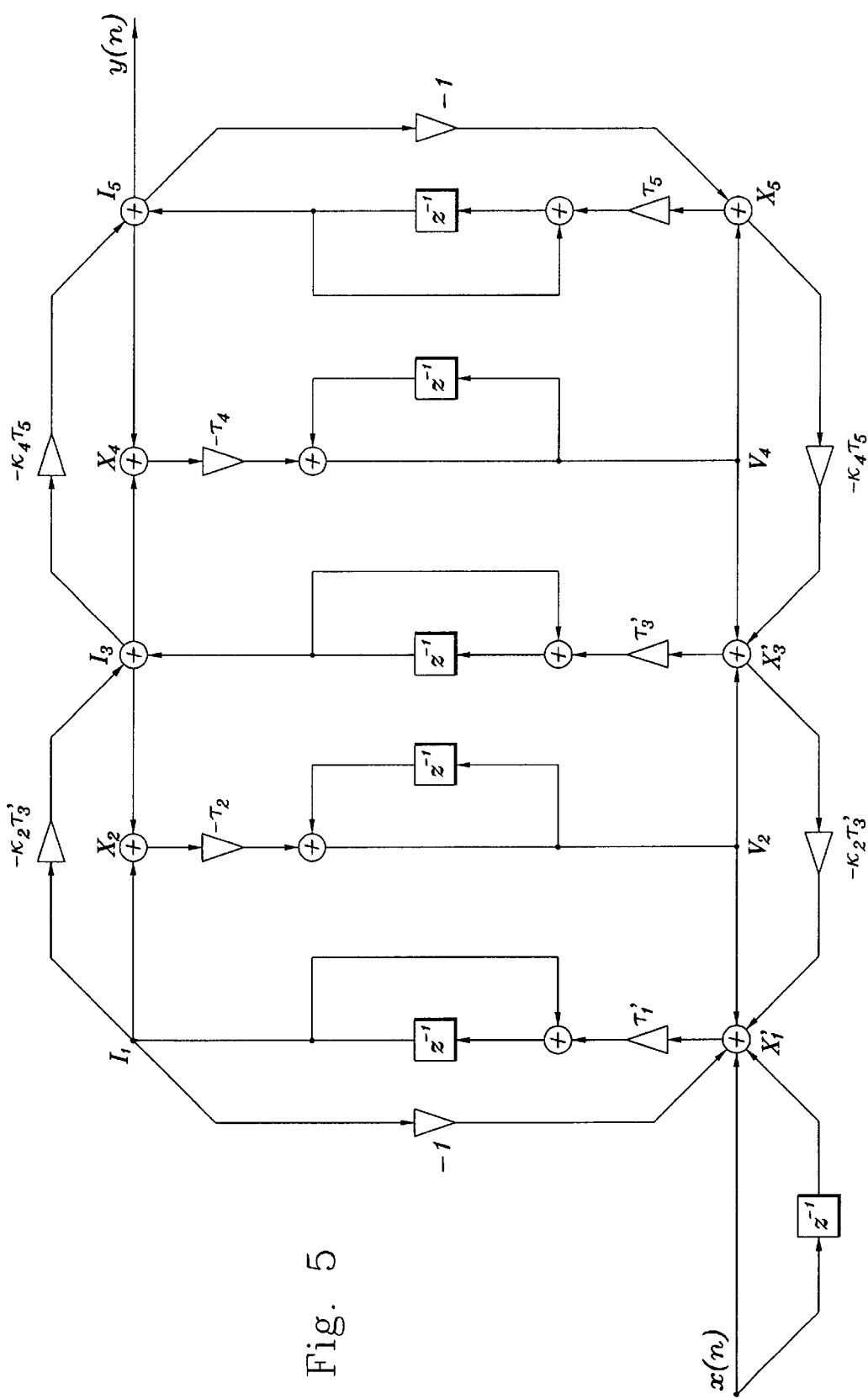
FIG. 5 is a block diagram of a real bilinear digital ladder filter (BDLF filter)
Figure 6:
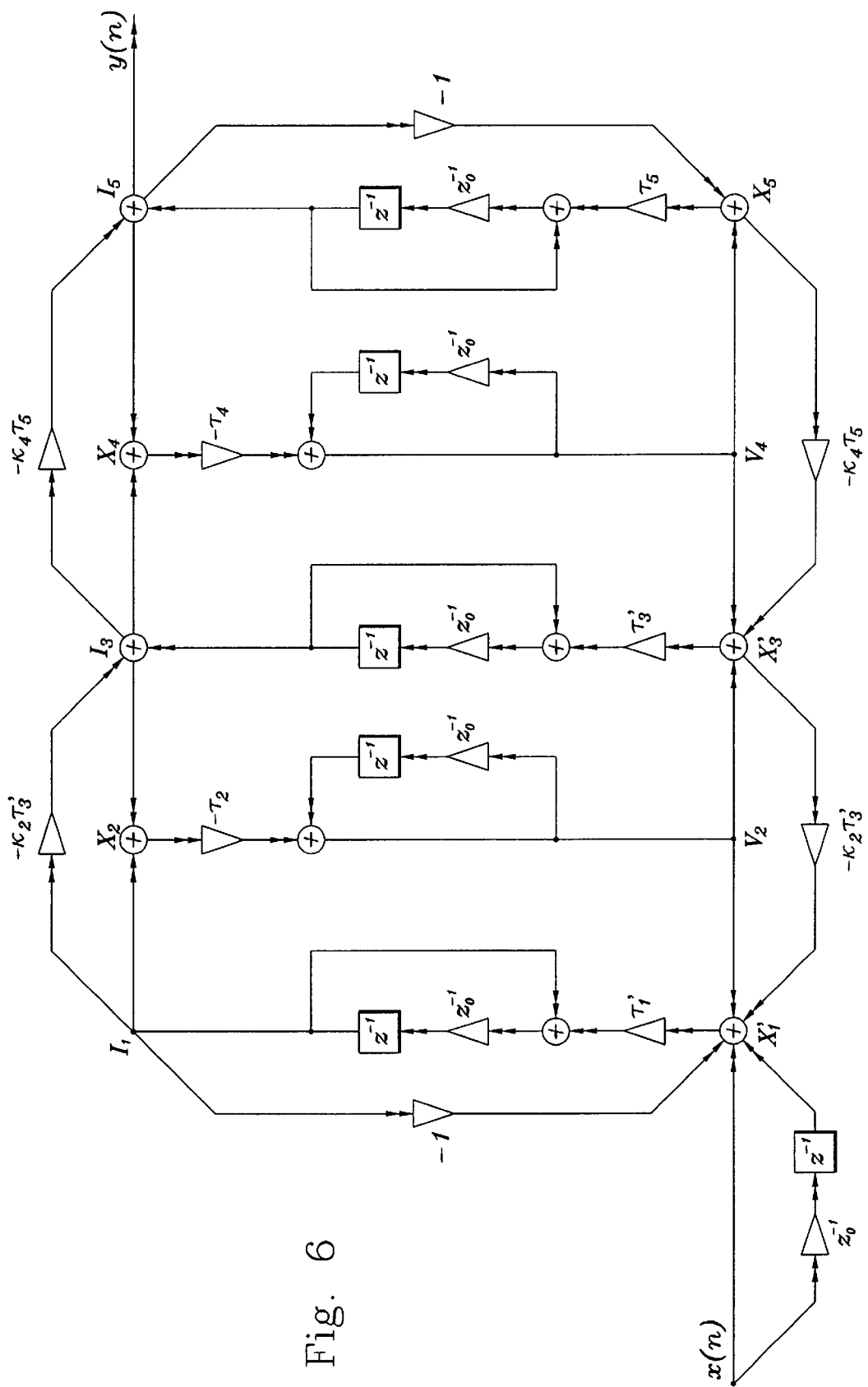
FIG. 6 is a block diagram of an embodiment of a corresponding complex BDLF filter.

FIG. 5 shows a block diagram of a real fifth order BDLF low-pass filter. In this figure the same designations have been used as in [2]. Of special interest here are the delay elements $z^{-1}$. If these elements are supplemented by a multiplication by $z_0^{-1}$ this low-pass filter may be transformed into a complex bandpass filter as the filters of FIGS. 2 and 3. Such a complex BDLF bandpass filter is illustrated in the block diagram of FIG. 6. One reason complex BDLF filters are preferred is that they maintain the excellent properties of real BDLF filters mentioned above.

Figure 7:
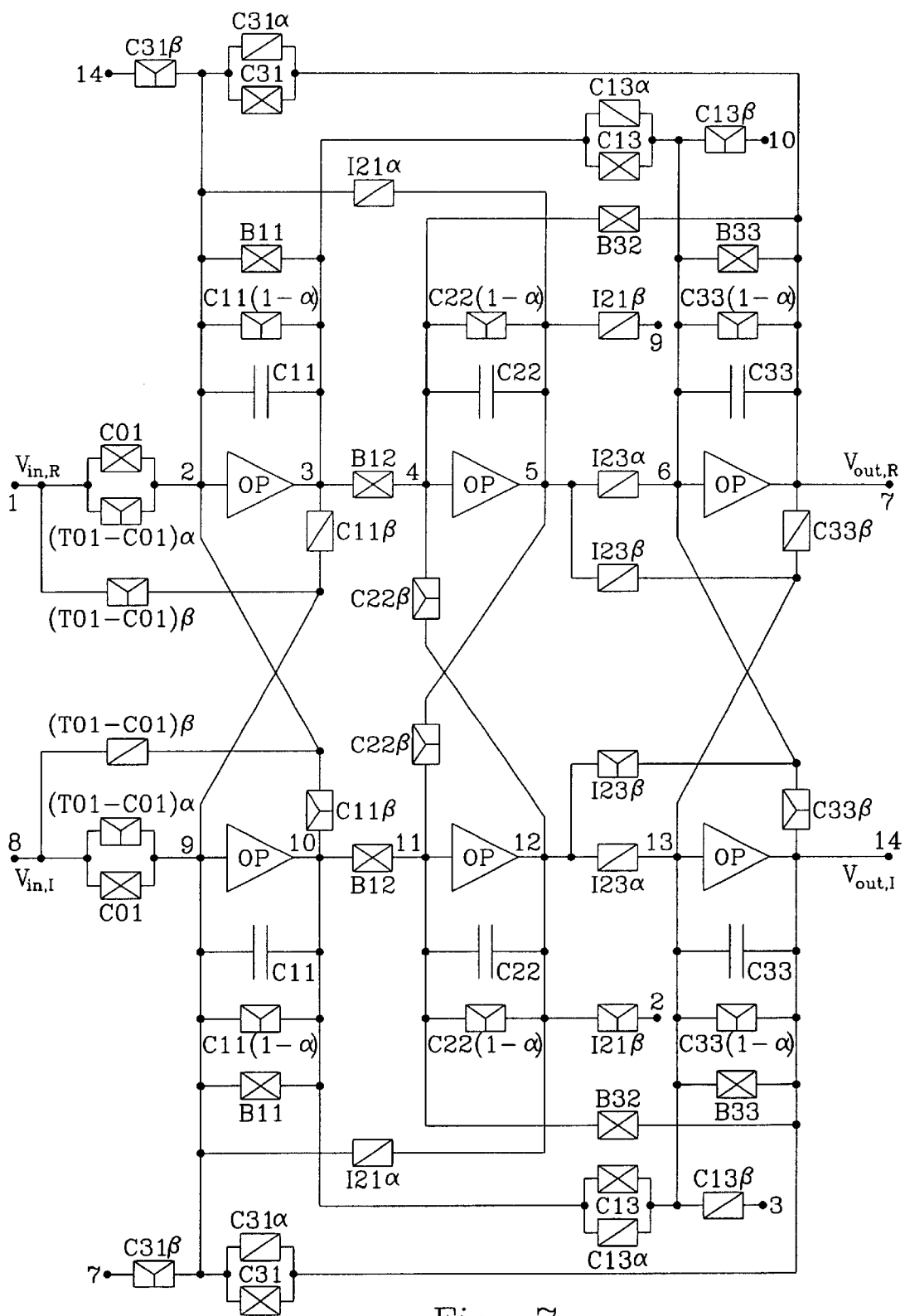
FIG. 7 is an embodiment of a complex switched capacitor bandpass filter.

Another type of complex bandpass filter that may be used is a complex switched capacitor filter. The complex filter may be obtained by frequency shifting the basic B, I, T and C elements of a real switched capacitor lowpass filter. An example of such a filter is shown in FIG. 7, in which a third order complex switched capacitor bandpass filter based on an analog elliptic lowpass prototype filter is illustrated. Furthermore, the numbered connection points 2–7 and 9–14 are assumed to be connected in pairs 2—2, 3—3, etc. This assumption facilitates the drawing.

After having described complex filters as such, the application of these filters to the down- and up-conversion according to the present invention will now be described. However, before the invention is explained, the prior art solution of the conversion problem will be described in more detail with reference to FIGS. 8–13. In this description the sign conventions of [3] will be used (it is to be noted, however, that different sign conventions exist in electrical engineering, which result in sign conversions at appropriate places).

Figure 8:
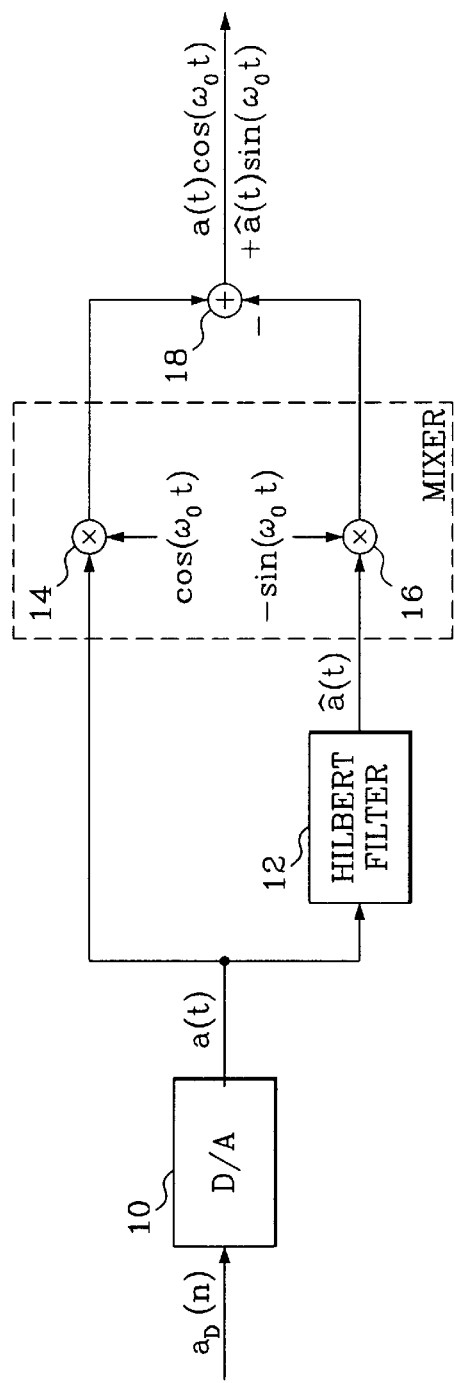
FIG. 8 is a block diagram of a prior art up-converter.

FIG. 8 illustrates the process of up-converting a digital baseband signal $a_D(n)$ in a single sideband up-converter. The digital signal is converted into an analog signal $a(t)$ in a D/A converter 10. Signal $a(t)$ is then divided into two branches. One of the branches is connected to a Hilbert filter 12 for forming the Hilbert transform $â(t)$ of signal $a(t)$. The two branches are thereafter forwarded to a mixer 14,16. The resulting components are added in an adder 18 (one of the components may be inverted before addition, depending on whether the upper or lower sideband will be retained). Thus, in FIG. 8 (where the upper sideband is selected) the modulated signal is of the form:

$$x(t)=a(t)\cos \omega_0 t+â(t)\sin \omega_0 t \quad (2)$$

Figure 9:
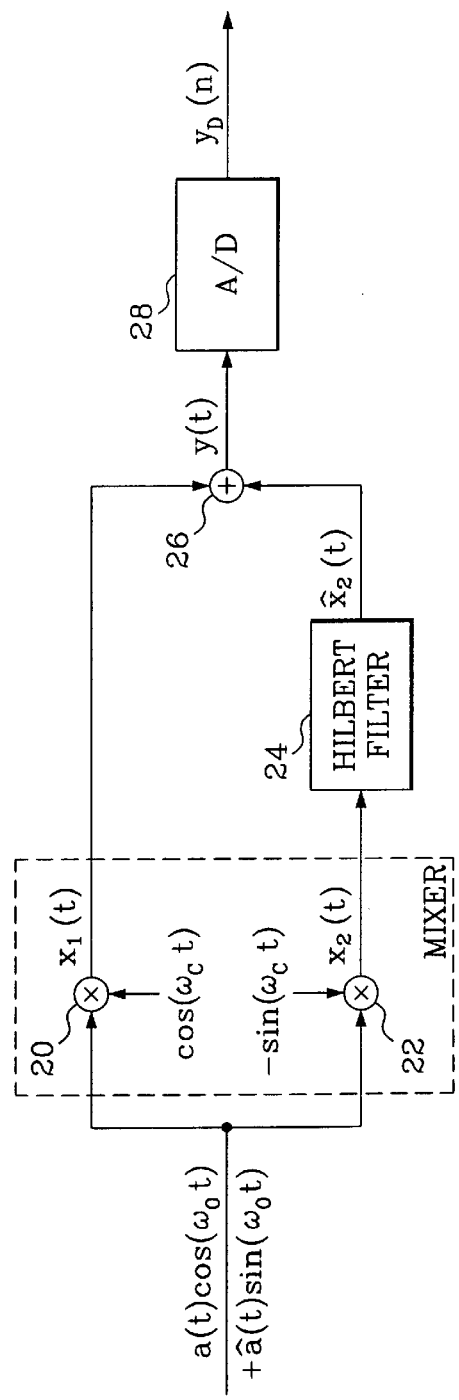
FIG. 9 is a block diagram of a prior art down-converter.

The single sideband down-converter illustrated in FIG. 9 receives a high frequency input signal $x(t)$ having this form. Here $a(t)$ is the (deterministic) information containing baseband part that is to be reconstructed. This signal is forwarded to a mixer 20, 22, which forms a composite signal having the following in-phase and quadrature components:

$$\begin{cases} x_1(t) = [a(t)\cos\omega_0 t + â(t)\sin\omega_0 t]\cos\omega_C t \\ \quad = \frac{1}{2}a(t)\{\cos(\omega_0-\omega_C)t + \cos(\omega_0+\omega_C)t\} + \\ \quad \quad \frac{1}{2}â(t)\{\sin(\omega_0-\omega_C)t + \sin(\omega_0+\omega_C)t\} \\ x_2(t) = [a(t)\cos\omega_0 t + â(t)\sin\omega_0 t](-\sin\omega_C t) \\ \quad = \frac{1}{2}a(t)\{\sin(\omega_0-\omega_C)t - \sin(\omega_0+\omega_C)t\} - \\ \quad \quad \frac{1}{2}â(t)\{\cos(\omega_0-\omega_C)t - \cos(\omega_0+\omega_C)t\} \end{cases} \quad (3)$$

The mixing process of equation (3) is illustrated in the frequency domain in FIG. 10. Here "F{·}" denotes Fourier transformation and "*" denotes convolution. Furthermore, dashed lines indicate pure imaginary Fourier transforms. From equation (3) and FIG. 10 it may be seen that the result of the mixing step is to split the spectrum of the high frequency signal into a signal having sum/difference frequency bands.

One of the components (in-phase or quadrature component) of the composite signal is forwarded to a Hilbert filter 24. Such a filter has the transfer function (with the sign convention used in [3]):

$$H_{HILB}(\omega)=j \, sgn(\omega) \quad (4)$$

This transfer function is illustrated in FIG. 11. Furthermore, in FIG. 11 "x" denotes multiplication. The effect of applying the Hilbert filter is to multiply positive frequency Fourier transform components by j and negative frequency Fourier transform components by −j. Fourier transforming $x_2(t)$ in (3) gives:

$$X_2(\omega) = \frac{1}{2}A(\omega)*\left\{\frac{1}{2j}(\delta(\omega-(\omega_0-\omega_C))-\delta(\omega+(\omega_0-\omega_C)))\right\} - \quad (5)$$
$$\frac{1}{2}A(\omega)*\left\{\frac{1}{2j}(\delta(\omega-(\omega_0+\omega_C))-\delta(\omega+(\omega_0+\omega_C)))\right\} -$$
$$\frac{1}{2}Â(\omega)*\left\{\frac{1}{2}(\delta(\omega-(\omega_0-\omega_C))+\delta(\omega+(\omega_0-\omega_C)))\right\} +$$
$$\frac{1}{2}Â(\omega)*\left\{\frac{1}{2}(\delta(\omega-(\omega_0+\omega_C))+\delta(\omega+(\omega_0+\omega_C)))\right\}$$

which may be rearranged as:

$$X_2(\omega) = \frac{1}{2}A(\omega)*\left\{\frac{1}{2j}(\delta(\omega-(\omega_0-\omega_C))-\delta(\omega-(\omega_0+\omega_C)))\right\} -$$
$$\frac{1}{2}A(\omega)*\left\{\frac{1}{2j}(\delta(\omega+(\omega_0-\omega_C))-\delta(\omega+(\omega_0+\omega_C)))\right\} -$$
$$\frac{1}{2}Â(\omega)*\left\{\frac{1}{2}(\delta(\omega-(\omega_0-\omega_C))-\delta(\omega-(\omega_0+\omega_C)))\right\} -$$
$$\frac{1}{2}Â(\omega)*\left\{\frac{1}{2}(\delta(\omega+(\omega_0-\omega_C))-\delta(\omega+(\omega_0+\omega_C)))\right\}$$

The effect of the Hilbert filter may now be calculated as (remembering that $\omega_0-\omega_C$ and $\omega_0+\omega_C$ are both positive quantities):

$$\hat{X}_2(\omega) = H_{HILB}(\omega)X_2(\omega)$$
$$= j \cdot \frac{1}{2}A(\omega)*\left\{\frac{1}{2j}(\delta(\omega-(\omega_0-\omega_C))-\delta(\omega-(\omega_0+\omega_C)))\right\} -$$

-continued $$(-j) \cdot \frac{1}{2} A(\omega) *$$

$$\left\{ \frac{1}{2j} (\delta(\omega + (\omega_0 - \omega_C)) - \delta(\omega + (\omega_0 + \omega_C))) \right\} -$$

$$j \cdot \frac{1}{2} \hat{A}(\omega) * \left\{ \frac{1}{2} (\delta(\omega - (\omega_0 - \omega_C)) - \delta(\omega - (\omega_0 + \omega_C))) \right\} -$$

$$(-j) \cdot \frac{1}{2} \hat{A}(\omega) * \left\{ \frac{1}{2} (\delta(\omega + (\omega_0 - \omega_C)) - \delta(\omega + (\omega_0 + \omega_C))) \right\}$$

By collecting terms this simplifies to:

$$\hat{X}_2(\omega) = \frac{1}{2} A(\omega) * \left\{ \frac{1}{2} (\delta(\omega - (\omega_0 - \omega_C)) + \delta(\omega + (\omega_0 - \omega_C))) \right\} - \quad (6)$$

$$\frac{1}{2} A(\omega) * \left\{ \frac{1}{2} (\delta(\omega - (\omega_0 + \omega_C)) + \delta(\omega + (\omega_0 + \omega_C))) \right\}$$

$$\frac{1}{2} \hat{A}(\omega) * \left\{ \frac{1}{2j} (\delta(\omega - (\omega_0 - \omega_C)) - \delta(\omega - (\omega_0 + \omega_C))) \right\} -$$

$$\frac{1}{2} \hat{A}(\omega) * \left\{ \frac{1}{2j} (\delta(\omega + (\omega_0 - \omega_C)) - \delta(\omega + (\omega_0 + \omega_C))) \right\}$$

$$= F \left\{ \frac{1}{2} a(t) (\cos(\omega_0 - \omega_C) t - \cos(\omega_0 + \omega_C) t) \right\} +$$

$$F \left\{ \frac{1}{2} \hat{a}(t) (\sin(\omega_0 - \omega_C) t - \sin(\omega_0 + \omega_C) t) \right\}$$

This result is illustrated in the right part of FIG. 11. The filtered signal is added to the other intermediate signal component in an adder 26 to produce a low frequency signal y(t) in accordance with the equation:

$$y(t) = x_1(t) + \hat{x}_2(t) = a(t)\cos(\omega_0 - \omega_C)t + \hat{a}(t)\sin(\omega_0 - \omega_C)t \quad (7)$$

as illustrated in FIG. 12. From equation (7) it is apparent that the baseband signal a(t) may be recovered if $\omega_C$ is chosen equal to $\omega_0$. Finally the demodulated signal may be digitized in an A/D converter 28.

Down- and up-conversion in accordance with the present invention will now be explained with reference to FIGS. 13–29.

FIG. 13 is a block diagram illustrating an embodiment of a down-converter in accordance with the present invention. A high frequency signal x(t) in accordance with equation (2) is forwarded to a first mixer 30, 32, which forms a composite signal u(t) having the following in-phase and quadrature components:

$$\begin{cases} u_1(t) = [a(t)\cos\omega_0 t + \hat{a}(t)\sin\omega_0 t]\cos\omega_A t \\ \quad = \frac{1}{2} a(t)\{\cos(\omega_0 - \omega_A)t + \cos(\omega_0 + \omega_A)t\} + \\ \quad \quad \frac{1}{2} \hat{a}(t)\{\sin(\omega_0 - \omega_A)t + \sin(\omega_0 + \omega_A)t\} \\ u_2(t) = [a(t)\cos\omega_0 t + \hat{a}(t)\sin\omega_0 t](-\sin\omega_A t) \\ \quad = \frac{1}{2} a(t)\{\sin(\omega_0 - \omega_A)t - \sin(\omega_0 + \omega_A)t\} - \\ \quad \quad \frac{1}{2} \hat{a}(t)\{\cos(\omega_0 - \omega_A)t - \cos(\omega_0 + \omega_A)t\} \end{cases} \quad (8)$$

Figure 14:
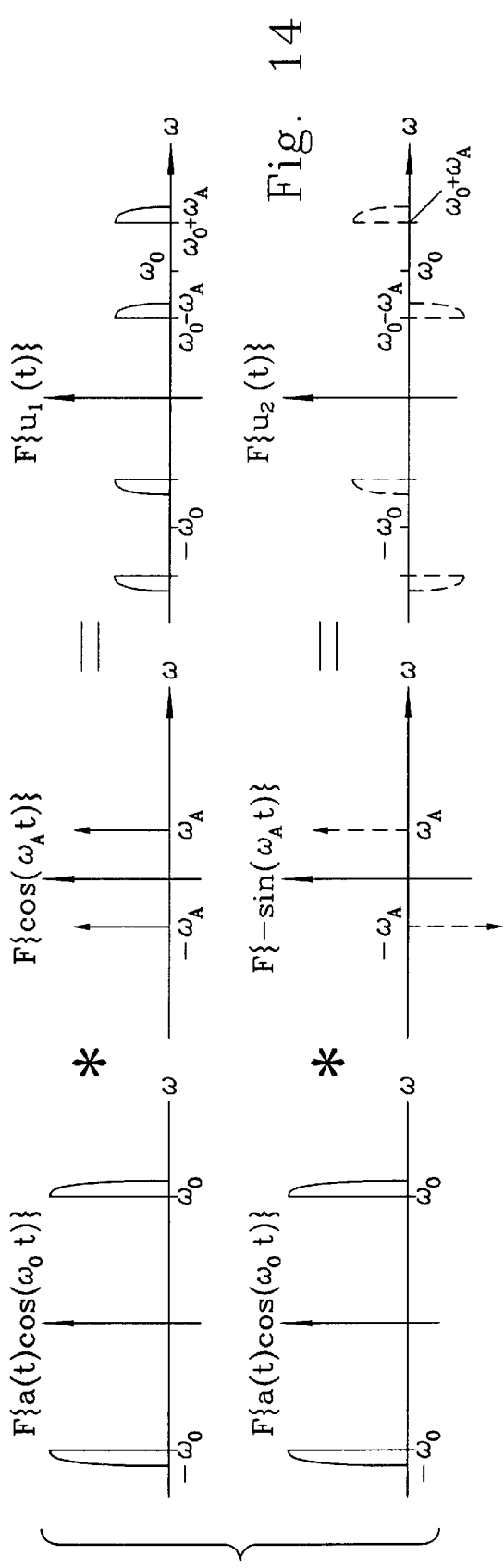

The mixing process of equation (8) is illustrated in the frequency domain in FIG. 14. As previously "F{·}" denotes Fourier transformation and "*" denotes convolution. Furthermore, dashed lines indicate pure imaginary Fourier transforms. From equation (8) and FIG. 14 it may be seen that the result of the mixing step is to split the spectrum of the high frequency signal into a signal having sum/difference frequency bands. This is similar to the mixing step in the down-converter in FIG. 9, except that the frequency shift $\omega_A$ is smaller than the frequency shift $\omega_C$ used in FIG. 9. Instead of using a Hilbert filter the down-converter in accordance with the present invention forwards the in-phase and quadrature components $u_1(t)$, $u_2(t)$ of composite signal u(t) to a complex bandpass filter 34. This complex bandpass filter is formed by shifting a real lowpass filter, ideally represented by the transfer function:

$$H_{LP} = (\omega) = \begin{cases} 1 & |\omega| < \omega_G \\ 0.5 & |\omega| = \omega_G \\ 0 & |\omega| > \omega_G \end{cases} \quad (9)$$

to the required frequency band ($\omega_G$ is the cut-off frequency of the filter). The resulting complex bandpass filter is represented by:

$$H_{BP}(\omega) = H_{LP}(\omega) * \delta[\omega - (\omega_0 - \omega_A + \omega_G)] \quad (10)$$

Figure 15:
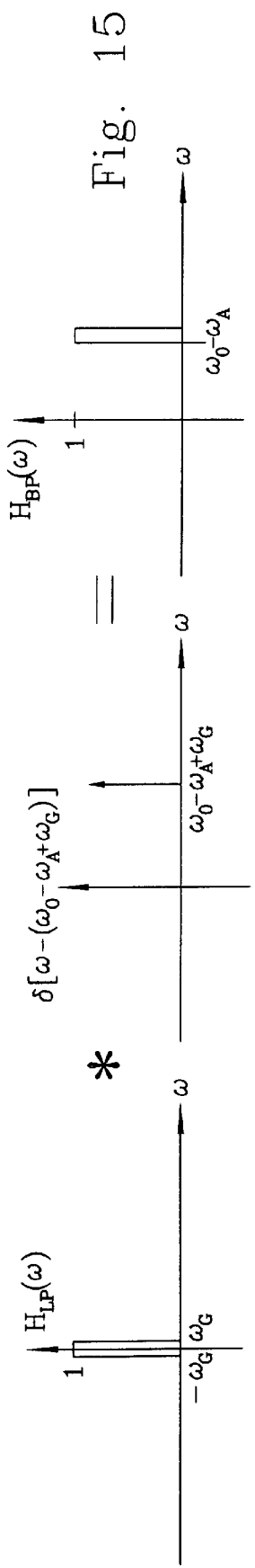

This frequency shifting process is illustrated in FIG. 15. In the illustrated case the frequency shift is $\omega_0 - \omega_A + \omega_G$ since the upper sideband is to be down-converted. If the lower sideband were to be down-converter, the required frequency shift would have been $\omega_0 - \omega_A - \omega_G$ instead.

The effect of complex bandpass filter 34 may best be seen by writing the composite signal u(t) in complex form:

$$u(t) = u_1(t) + j \cdot u_2(t) \quad (11)$$

$$= \frac{1}{2} a(t) \{ \exp((\omega_0 - \omega_A)t) + \exp(-(\omega_0 + \omega_A)t) \} -$$

$$\frac{j}{2} \hat{a}(t) \{ \exp((\omega_0 - \omega_A)t) + \exp(-(\omega_0 + \omega_A)t) \}$$

The effect of the bandpass filter is to block the frequency band around $-(\omega_0 + \omega_A)$ as illustrated in FIG. 16. The result is:

$$v(t) = v_1(t) + j \cdot v_2(t) = h_{BP}(t) * u(t) = \frac{1}{2} a(t) \exp((\omega_0 - \omega_A)t) - \frac{1}{2} \hat{a}(t) \exp((\omega_0 - \omega_A)t) \quad (12)$$

Thus $v_1(t)$ and $v_2(t)$ may be identified as:

$$v_1(t) = \frac{1}{2} a(t) \cos((\omega_0 - \omega_A)t) + \frac{1}{2} \hat{a}(t) \sin((\omega_0 - \omega_A)t)$$

$$v_2(t) = \frac{1}{2} a(t) \sin((\omega_0 - \omega_A)t) - \frac{1}{2} \hat{a}(t) \cos((\omega_0 - \omega_A)t) \quad (13)$$

This bandwidth limited signal is forwarded to a second mixer 36, 38 (in the following description second mixers in FIGS. 13, 19–21 are assumed to include lowpass filters, if necessary), which produces an intermediate signal having in-phase and quadrature components $w_1(t)$, $w_2(t)$ represented by:

$$\begin{cases} w_1(t) = v_1(t)\cos\omega_B t \\ \quad = \frac{1}{2} a(t)\{\cos(\omega_0 - \omega_A - \omega_B)t + \cos(\omega_0 - \omega_A + \omega_B)t\} + \\ \quad \quad \frac{1}{2} \hat{a}(t)\{\sin(\omega_0 - \omega_A - \omega_B)t + \sin(\omega_0 - \omega_A + \omega_B)t\} \\ w_2(t) = v_2(t)\sin\omega_B t \\ \quad = \frac{1}{2} a(t)\{\cos(\omega_0 - \omega_A - \omega_B)t - \cos(\omega_0 - \omega_A + \omega_B)t\} + \\ \quad \quad \frac{1}{2} \hat{a}(t)\{\sin(\omega_0 - \omega_A - \omega_B)t - \sin(\omega_0 - \omega_A + \omega_B)t\} \end{cases} \quad (14)$$

The second mixing step is also illustrated in FIG. 17. Finally, the components of the intermediate signal are added in an adder 40, which produces the low frequency signal:

$$w_1(t) + w_2(t) = \frac{1}{2} a(t) \cos(\omega_0 - \omega_A - \omega_B)t + \frac{1}{2} \hat{a}(t) \sin(\omega_0 - \omega_A - \omega_B)t \quad (15)$$

as illustrated in FIG. 18. If $\omega_{A+\omega B}$ is chosen to be equal to $\omega_0$, this expression reduces to ½·a(t), which is exactly the desired result, except for the factor ½ introduced by the second mixer 36, 38. If desired, this factor may be eliminated by an multiplication by 2 performed by an optional multiplier 42 (this multiplication may also be performed earlier, for example in one of the mixers). Finally the signal a(t) may be converted into a digital signal $a_D(t)$ in an AND converter 44.

It is noted that if $\omega_A + \omega_B$ is not equal to $\omega_0$, then the shape of the original spectrum in FIG. 14 and the final spectrum in FIG. 18 is the same. The only difference is that the peaks are closer in the final spectrum. Thus, if desired the process may be repeated to bring the signal further down in frequency.

The embodiment of FIG. 13 is mostly analog. By moving the A/D conversion further into the block diagram more and more digital implementations are possible.

FIG. 19 illustrates an embodiment of the down-converter in accordance with the present invention in which two A/D converters 44, 46 have been provided between the bandpass filter and the second mixer. This embodiment may utilize a complex switched capacitor bandpass filter 34SC, for example the filter illustrated in FIG. 7. Note that in this case the output $v_1(n)$, $v_2(n)$ from the filter is already in discrete-time form, only the actual digitalization has to be performed by the AND converters.

Naturally all elements after A/D converters 44, 46, such as mixer 36D, 38D, adder 40D and optional multiplier 42D are now digital. Thus, mixer 36D, 38D will now be 30 characterized by a normalized digital frequency $\omega_B$ instead of the analog frequency $\omega_B$.

If the A/D converters 44, 46 are moved further into the block diagram, as in the embodiment of FIG. 20, the complex bandpass filter may be digital, for example a BDLF filter 34D. As previously, in this embodiment elements to the right of A/D converters 44, 46 are digital.

Finally, an A/D converter 44 may be applied directly to the high frequency signal, as in the embodiment of FIG. 21. Depending on the application this may, however, require an A/D converter capable of handling very high frequency signals. As previously, in this embodiment elements to the right of A/D converter 44 are digital. In this embodiment both mixers are digital, and are characterized by normalized digital frequencies $\Omega_A$ and $\Omega_B$, respectively.

A complex bandpass filter may also be used to implement an up-converter (in accordance with the well known transposition theorem). Different embodiments of such an up-converter will now be described with reference to FIGS. 22–27.

Figure 22:
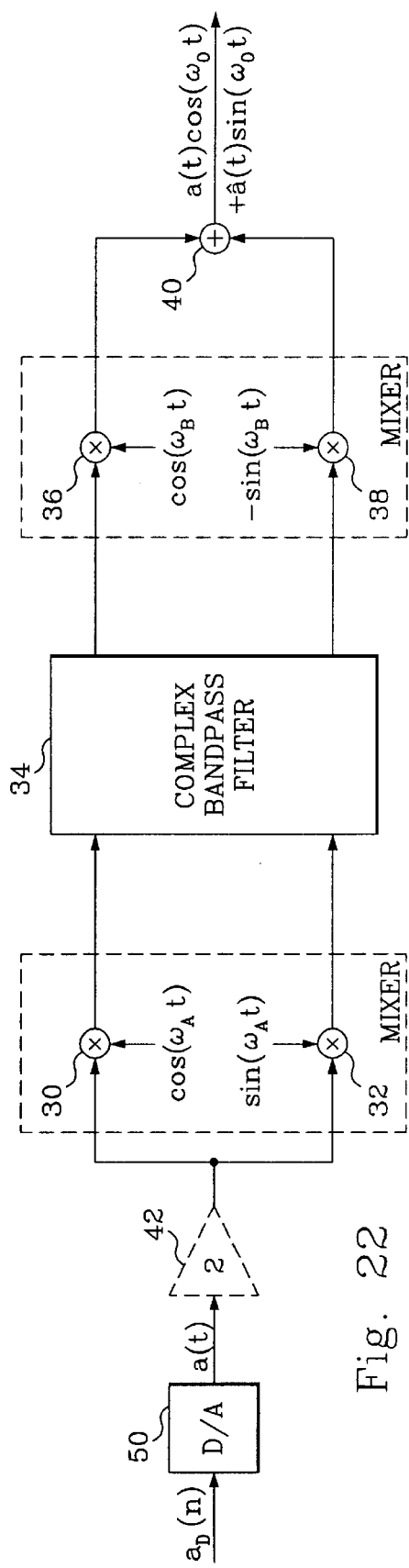
FIGS. 22–27 are block diagrams of different embodiments of the up-converter in accordance with the present invention.

In the embodiment of FIG. 22 a digital signal $a_D(n)$ is converted into an analog signal a(t) in a D/A converter 50 (D/A converters are assumed to include appropriate anti-imaging filters). A first mixer 30, 32 (in the following description first mixers in FIGS. 22–27 are assumed to include necessary lowpass filters) characterized by the frequency $\omega_A$ mixes the analog signal to a composite signal having an in-phase component and a quadrature component. A complex bandpass filter 34 filters this signal into a bandwidth limited signal. Depending on the location of the bandpass filter the upper or lower sideband will be selected. A second mixer 36, 38 characterized by the frequency $\omega_B$ mixes this bandwidth limited signal into an intermediate signal having in-phase and quadrature components. Finally an adder 40 forms the sum between the components of this intermediate signal. As in the down-converter an optional multiplier 42 may be provided to account for the factor ½ introduced by the two mixers (instead of only one mixer in the prior art illustrated in FIG. 8).

The up-converter may, as the down-converter, be more or less digital, depending on the location of the D/A conversion step.

Figure 23:
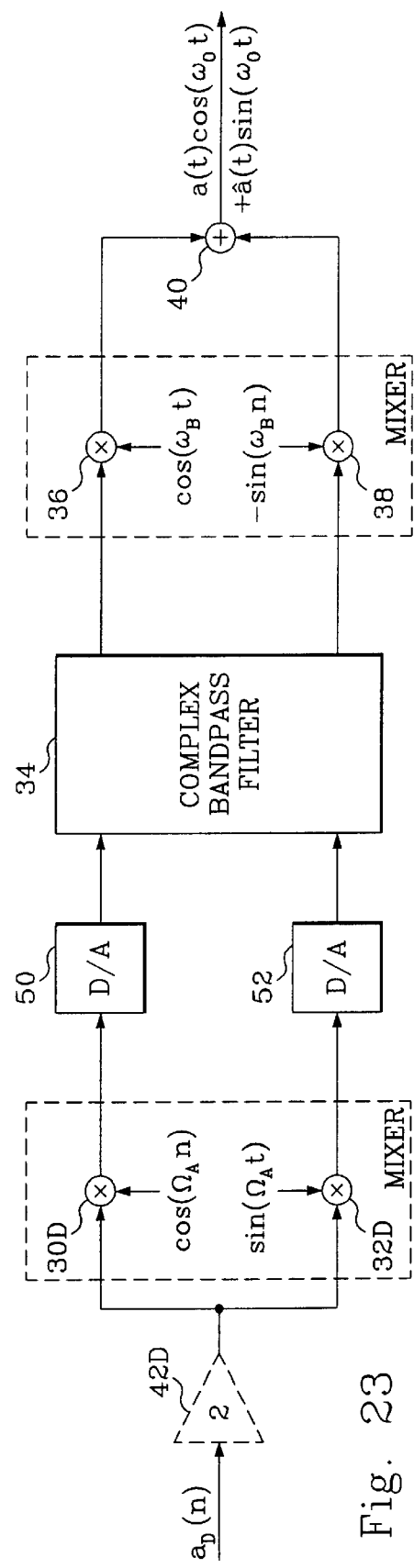

Thus, in the embodiment of FIG. 23 D/A converters 50, 52 have been provided between the first mixer and the complex bandpass filter. In this embodiment mixer 30D, 32D will be digital.

Figure 24:
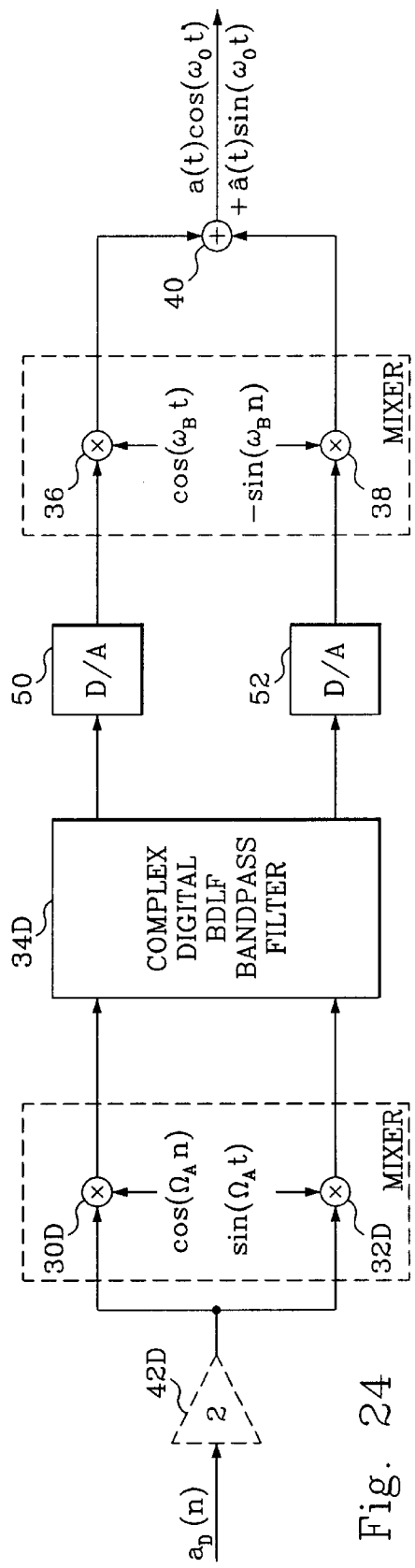
Figure 25:
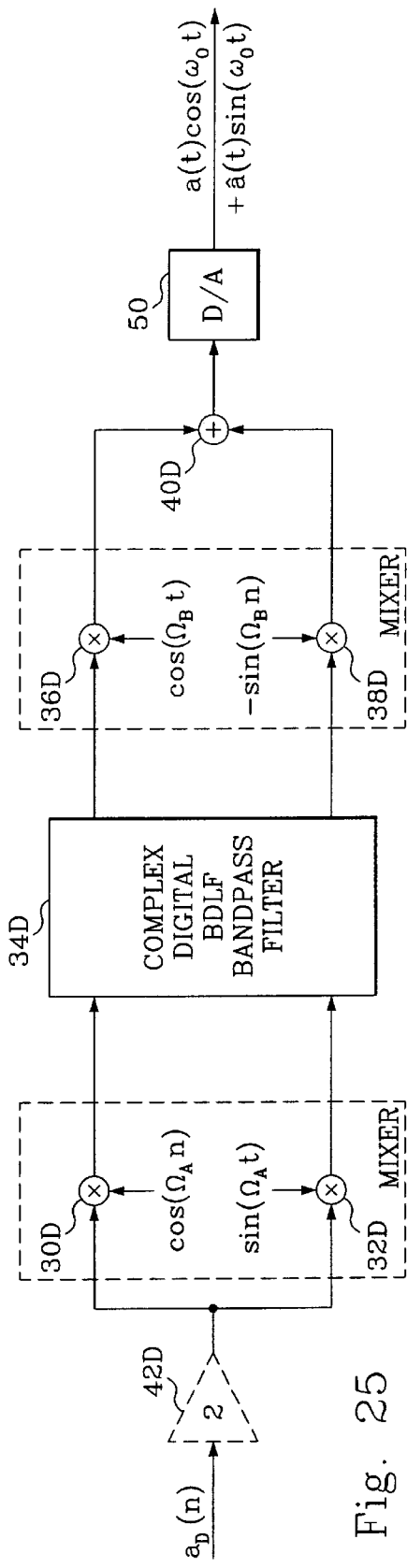

In the embodiments of FIGS. 24 and 25 the D/A conversion has been moved behind the complex filter, which is now a digital filter 34D, for example a complex digital BDLF bandpass filter. Depending on the location of the D/A converter the second mixer and the adder may be analog (FIG. 24) or digital (FIG. 25). It is also possible to perform the D/A conversion immediately before an analog addition.

Figure 26:
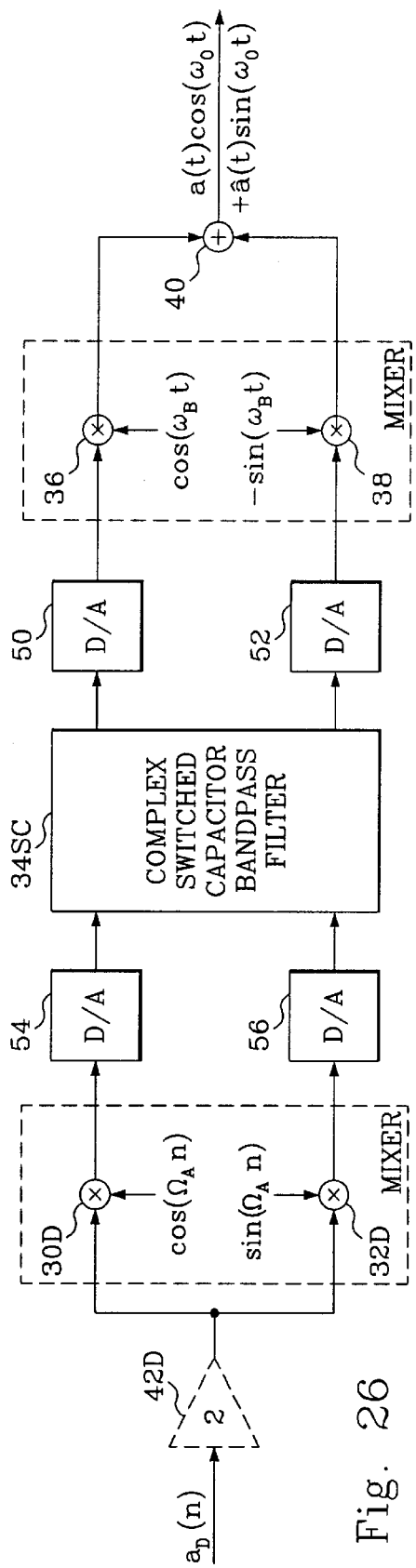
Figure 27:
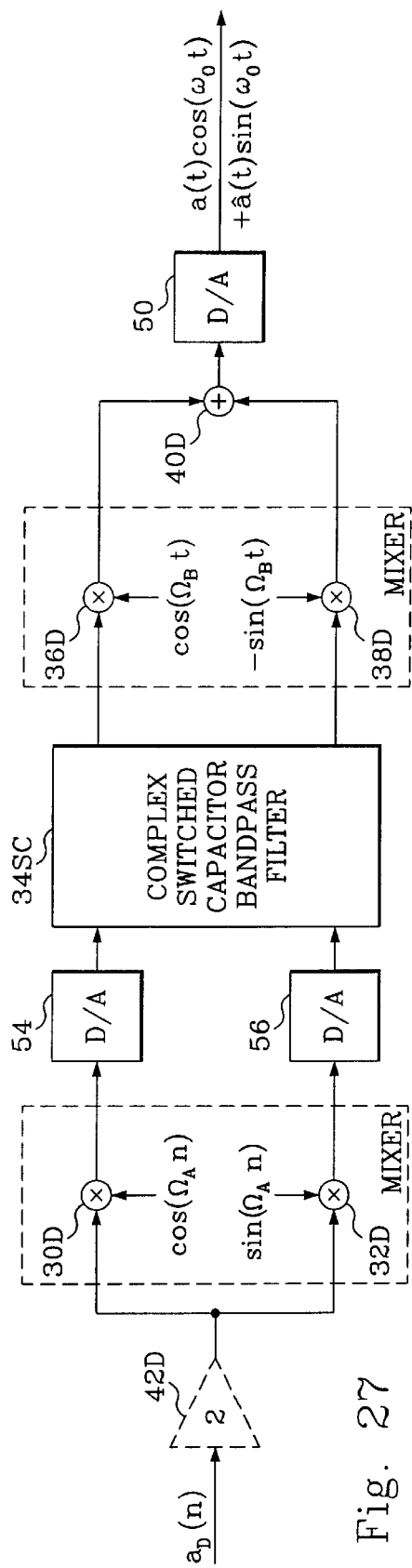

As in the case of the down-converter the up-converter may also be implemented with a complex switched capacitor bandpass filter 34SC as illustrated in FIGS. 26 and 27. Since a switched capacitor filter requires an analog input signal D/A converters 54, 56 are provided in front of the filter (naturally the D/A conversion may be performed earlier, as in the embodiment of FIG. 22). Furthermore, since the output signal of a switched capacitor filter is a discrete-time signal, a further D/A conversion is performed, either directly after the filter (FIG. 26) or after the second mixer (FIG. 27).

In the embodiments illustrated in this application, the components of the intermediate signal are added. This requires that the mixers have different phase relations ("–sin" and "sin"). If the mixers have the same phase relation, the components may be subtracted from each other instead to compensate for this.

Figure 28:
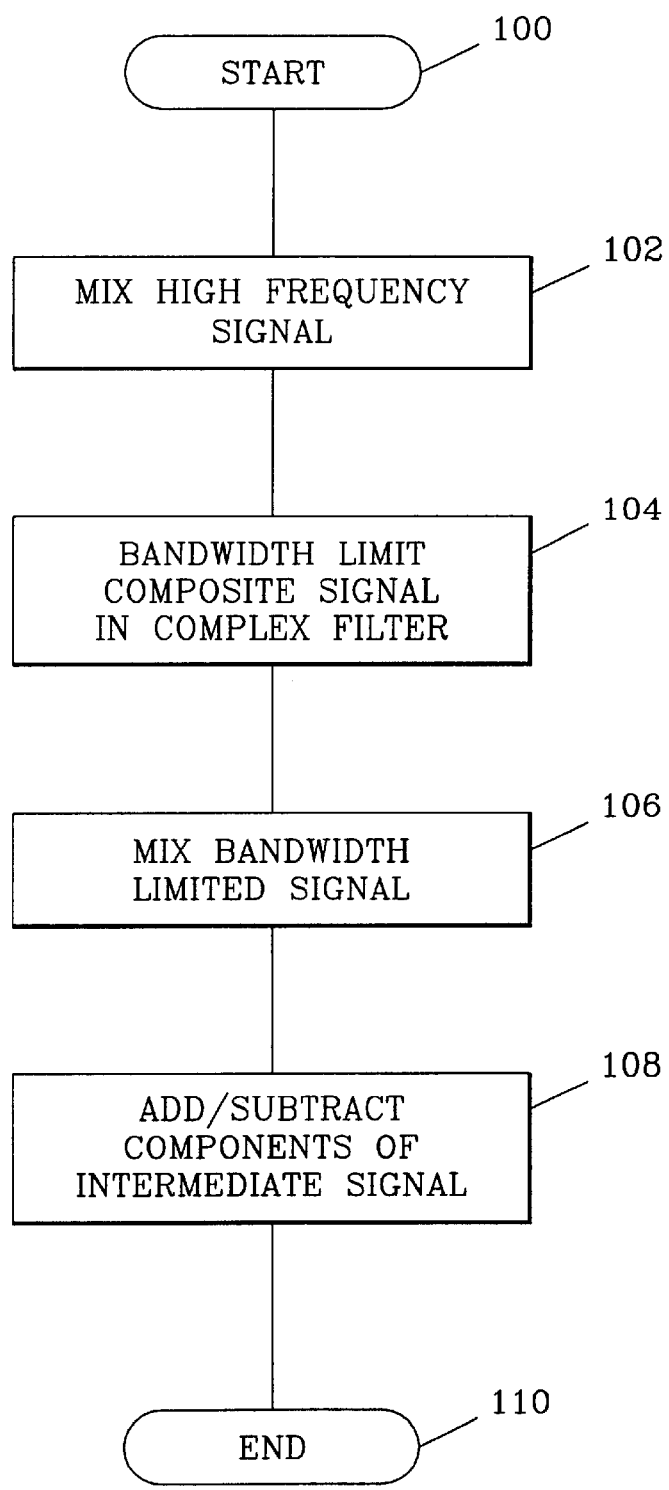
FIG. 28 is a flow chart illustrating the down-conversion method in accordance with the present invention.

FIG. 28 is a flow chart illustrating the down-conversion method in accordance with the present invention. The process starts in step 100. In step 102 the high frequency signal is mixed into a composite signal having an in-phase component and a quadrature component. In step 104 the composite signal is bandwidth limited, in a complex bandpass filter, into a bandwidth limited signal having an in-phase component and a quadrature component. In step 106 the bandwidth limited signal is mixed into an intermediate signal having an in-phase component and a quadrature component. In step 108 one component of the intermediate signal is added (subtracted) to (from) the other component. This ends the process in step 110.

Figure 29:
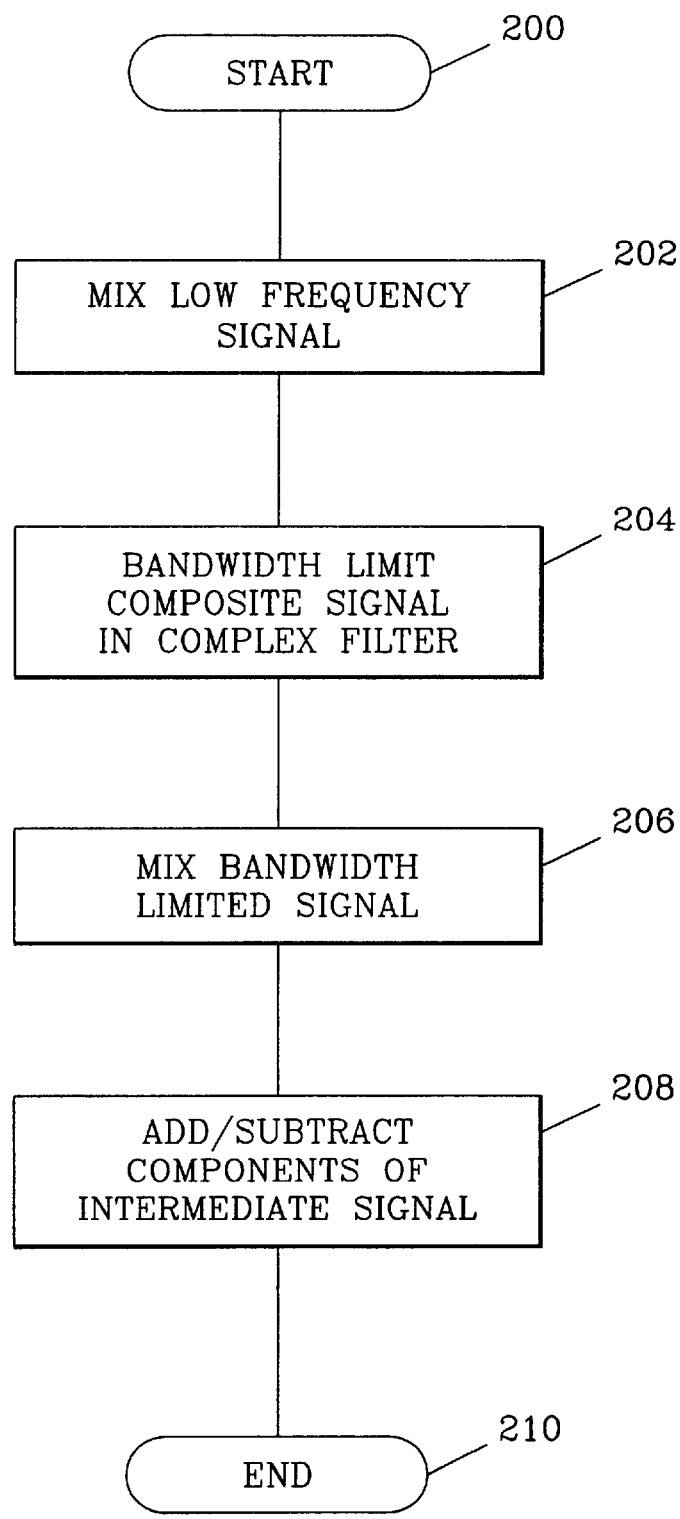
FIG. 29 is a flow chart illustrating the up-conversion method in accordance with the present invention.

FIG. 29 is a flow chart illustrating the up-conversion method in accordance with the present invention. The process starts in step 200. In step 202 the low frequency signal is mixed into a composite signal having an in-phase component and a quadrature component. In step 204 the composite signal is bandwidth limited, in a complex bandpass filter, into a bandwidth limited signal having an in-phase component and a quadrature component. In step 206 the bandwidth limited signal is mixed into an intermediate signal having an in-phase component and a quadrature component. In step 208 one component of the intermediate signal is added (subtracted) to (from ) to) the other component. This ends the process in step 210.

From the above description it is clear that an essential part of the present invention is the reconstruction (generation) of a low (high) frequency signal from a composite signal having an in-phase component and a quadrature component. Instead of using a Hilbert filter, as in the prior art, the invention uses a complex bandpass filter and a mixer. Since this part of the invention has already been described in detail with reference to and is embedded in the down- and up-converters, a further description is not necessary.

Furthermore, the present invention has been described with reference to single sideband amplitude modulation.

However, complex bandpass filters may also be used in other types of amplitude modulation, such as double sideband modulation, to eliminate Hilbert filters. In fact the present invention may be applied to modulation in general (amplitude, frequency, phase), both digital and analog, and to deterministic as well as stochastic signals.

It will be understood by those skilled in the art that various modifications and changes may be made to the present invention without departure from the spirit and scope thereof, which is defined by the appended claims.

What is claimed is:

1. A down-converter for converting a modulated high frequency signal into a low frequency signal, including a first mixer for mixing said high frequency signal into a composite signal having an in-phase component and a quadrature component, said down-converter comprising:

A/D converters for A/D conversion of the components of said composite signal:

a complex bandpass filter, coupled to the output of said first mixer, for bandwidth limiting said composite signal into a bandwidth limited signal having an in-phase component and a quadrature component, wherein said complex bandpass filter is a digital bandpass filter, and wherein said complex bandpass filter is a complex bilinear ladder filter;

a second mixer, coupled to the output of said complex bandpass filter, for mixing said bandwidth limited signal into an intermediate signal having an in-phase component and a quadrature component, wherein said second mixer is a digital mixer; and an adder, coupled to the output of said second mixer, for adding (subtracting) one component of said intermediate signal to (from) the other component, wherein said adder is a digital adder.

2. The down-converter of claim 1, wherein said high frequency-signal is a single sideband signal and said low frequency signal is a bandbased signal.

3. An up-converter for converting a low frequency digital signal into a modulated high frequency signal, including a first digital mixer for mixing said low frequency signal into a composite signal having an in-phase component and a quadrature component, said up-converter comprising:

a complex digital bandpass filter, coupled to the output of said first digital mixer, for bandwidth limiting said composite signal into a bandwidth limited signal having an in-phase component and a quadrature component, wherein said complex bandpass filter is a complex bilinear digital ladder filter;

D/A converters for D/A conversion of the components of said bandwidth limited signal;

a second mixer, coupled to the output of said D/A converters, for mixing said bandwidth limited signal into an intermediate signal having an in-phase component and a quadrature component; and an adder, coupled to the output of said second mixer, for adding (subtracting) one component of said intermediate signal to (from) the other component.

4. An up-converter for converting a low frequency digital signal into a modulated high frequency signal, including a first digital mixer for mixing said low frequency signal into a composite signal having an in-phase component and a quadrature component, said up-converter comprising:

a set of D/A converters for D/A conversion of the components of said composite signal;

a complex bandpass filter, coupled to the output of said D/A converters, for bandwidth limiting said composite signal into a bandwidth limited signal having an in-phase component and a quadrature component, wherein said complex bandpass filter is a complex switched capacitor filter;

a set of A/D converters for A/D conversion of the components of said bandwidth limited signal;

a second mixer, coupled to the output of said A/D converters, for mixing said bandwidth limited signal into an intermediate signal having an in-phase component and a quadrature component; and an adder, coupled to the output of said second mixer, for adding (subtracting) one component of said intermediate signal to (from) the other component.

5. An up-converter for converting a low frequency digital signal into a modulated high frequency signal, including a first digital mixer for mixing said low frequency signal into a composite signal having an in-phase component and a quadrature component, said up-converter comprising;

a first set of D/A converters for D/A conversion of the components of said composite signal;

a complex bandpass filter, coupled to the output of said D/A converters, for bandwidth limiting said composite signal into a bandwidth limited signal having an in-phase component and a quadrature component, wherein said complex bandpass filter is a complex switched capacitor filter;

a second digital mixer, coupled to the output of said complex bandpass filter, for mixing said bandwidth limited signal into an intermediate signal having an in-phase component and a quadrature component;

a digital adder; coupled to the output of said second digital mixer, for adding (subtracting) one component of said intermediate signal to (from) the other component; and a further D/A converter for D/A conversion of the output signal from said digital adder.

6. An apparatus for reconstructing a low frequency signal from a composite signal having an in-phase component and a quadrature component, comprising:

A/D converters for A/D conversion of the components of said composite signal;

a complex bandpass filter for bandwidth limiting said composite signal into a bandwidth limited signal having an in-phase component and a quadrature component, wherein said complex bandpass filter is a complex bilinear digital ladder filter;

a digital mixer, coupled to the output of said complex bandpass filter, for mixing said bandwidth limited signal into an intermediate signal having an in-phase component and a quadrature component; and a digital adder, coupled to the output of said mixer, for adding (subtracting) one component of said intermediate signal to (from) the other component.

7. The apparatus of claim 6, wherein said low frequency signal is a baseband signal.

8. An apparatus for generating a high frequency signal from a digital composite signal having an in-phase component and a quadrature component comprising:

a complex bandpass filter for bandwidth limiting said component signal into a bandwidth limited signal having an in-phase component and a quadrature component, wherein said complex bandpass filter is a complex bilinear digital ladder filter;

D/A converters for D/A conversion of the components of said bandwidth limited signal;

a mixer, coupled to the output of said D/A converters, for mixing said bandwidth limited signal into an intermediate signal having an in-phase component and a quadrature component; and an adder, coupled to the output of said mixer, for adding (subtracting) one component of said intermediate signal to (from) the other component.

9. The apparatus of claim 8, wherein said high frequency signal is a single sideband signal.

10. An apparatus for generating a high frequency signal from a composite digital signal having an in-phase component and a quadrature component comprising:

a set of D/A converters for D/A conversion of the components of said composite digital signal, a complex bandpass filter for bandwidth limiting said component signal into a bandwidth limited signal having an in-phase component and a quadrature component, wherein said complex bandpass filter is a complex switched capacitor filter;

a set of A/D converters for A/D conversion of the components of said bandwidth limited signal;

a mixer, coupled to the output of said A/D converters, for mixing said bandwidth limited signal into an intermediate signal having an in-phase component and a quadrature component; and an adder, coupled to the output of said mixer, for adding (subtracting) one component of said intermediate signal to (from) the other component.

\* \* \* \* \*